(12) United States Patent
Nakashima

(10) Patent No.: US 8,658,908 B2
(45) Date of Patent: Feb. 25, 2014

(54) MULTIPLE PATTERNING WIRING BOARD, WIRING BOARD AND ELECTRONIC APPARATUS

(75) Inventor: Shuzou Nakashima, Satsumasendai (JP)

(73) Assignee: Kyocera Corporation, Kyoto (JP)

( * ) Notice: Subject to any disclaimer, the term of this patent is extended or adjusted under 35 U.S.C. 154(b) by 79 days.

(21) Appl. No.: 13/254,138

(22) PCT Filed: Jun. 23, 2010

(86) PCT No.: PCT/JP2010/060658
§ 371 (c)(1),
(2), (4) Date: Aug. 31, 2011

(87) PCT Pub. No.: WO2010/150820
PCT Pub. Date: Dec. 29, 2010

(65) Prior Publication Data
US 2011/0315439 A1    Dec. 29, 2011

(30) Foreign Application Priority Data
Jun. 25, 2009   (JP) .................................. 2009-150614

(51) Int. Cl.
*H05K 1/16* (2006.01)

(52) U.S. Cl.
USPC ............ 174/260; 438/462; 438/465; 361/816

(58) Field of Classification Search
USPC ....................................................... 438/465
See application file for complete search history.

(56) References Cited

U.S. PATENT DOCUMENTS

| | | | | |
|---|---|---|---|---|
| 3,608,186 A | * | 9/1971 | Hutson | .......................... 438/114 |
| 5,024,970 A | * | 6/1991 | Mori | ............................. 438/462 |
| 7,087,857 B2 | * | 8/2006 | Nakamura et al. | ........ 219/121.72 |
| 2003/0042596 A1 | * | 3/2003 | Crane et al. | .................... 257/690 |
| 2009/0101395 A1 | | 4/2009 | Horikiri et al. | |
| 2009/0294928 A1 | * | 12/2009 | Kim et al. | ...................... 257/659 |

FOREIGN PATENT DOCUMENTS

| | | |
|---|---|---|
| CN | 101420819 A | 4/2009 |
| JP | 2004-200631 | 7/2004 |
| JP | 2006-041456 | 2/2006 |
| JP | 2006-128363 | 5/2006 |
| JP | 2008-147234 | 6/2008 |
| JP | 2010-080567 | 4/2010 |

OTHER PUBLICATIONS

Chinese language office action dated Jun. 5, 2013 and its English language Statement of Relevance of Non-English References Pursuant to 37 CFR 1.98(a)(3)(i) issued in corresponding Chinese application 201080009867.3.

* cited by examiner

*Primary Examiner* — Tuan T Dinh
*Assistant Examiner* — Steven T Sawyer
(74) *Attorney, Agent, or Firm* — DLA Piper LLP (US)

(57) ABSTRACT

A multiple patterning wiring board includes a base substrate including a plurality of wiring board regions arranged in rows and columns, the wiring board regions each including an electronic component mounting region in a center portion thereof, a dividing groove at borders between wiring board regions in one main face of the base substrate, a lid member bonding region being formed between the electronic component mounting region and the dividing groove in the main face of the base substrate, and the lid member bonding region 1c including a groove, the groove having a width less than or equal to the width of the region and a depth that is less than a depth of the dividing groove.

6 Claims, 14 Drawing Sheets

(a)

(b)

(a)

(b)

(a)

(b)

(a)

SECTION A (b)

SECTION A (a)

(b)

(a)

(b)

(a)

(b)

(a)

(b)

MULTIPLE PATTERNING WIRING BOARD, WIRING BOARD AND ELECTRONIC APPARATUS

CROSS-REFERENCE TO THE RELATED APPLICATIONS

This application is a national stage of international application No. PCT/JP2010/060658, filed Jun. 23, 2010, and claims the benefit of priority under 35 USC 119 to Japanese Patent Application No. 2009-150614, filed on Jun. 25, 2009, the entire contents of which are incorporated herein by reference.

TECHNICAL FIELD

The present invention relates to a multiple patterning wiring board comprising a base substrate comprising a plurality of wiring board regions arranged in rows and columns in a center portion thereof, the wiring board regions each serving as a wiring board for mounting an electronic component, and a dividing groove being formed at borders between wiring board regions, as well as a wiring board obtained as a result of the multiple patterning wiring board being divided, and an electronic apparatus in which an electronic component is mounted on and a lid member is bonded to the wiring board.

BACKGROUND ART

Conventional wiring boards for mounting electronic components such as semiconductor devices and crystal oscillators are formed by, for example, disposing a wiring conductor comprising a metallized conductor containing a metal powder such as tungsten or molybdenum on a surface of an insulating base body made of an electrically insulating material such as an aluminum oxide sintered body.

Such a wiring board usually includes an electronic component mounting region provided with wiring conductors drawn to the surface so as to be connected to an electronic component. An electronic component is mounted on the electronic component mounting region of such a wiring board, each electrode of the electronic component is electrically connected to the corresponding one of the wiring conductors via electrically connecting means such as solder or a bonding wire, and a lid member made of a metal, ceramics, glass, a resin or the like is bonded such that the lid member covers the electronic component so as to seal the electronic component. An electronic apparatus is produced in this manner.

The lid member is bonded to the wiring board by, for example, using a sealant such as a resin. With the trend toward smaller electronic apparatuses, the width of a region in which the wiring board and the lid member are bonded is decreasing, and demand is growing for increased bonding strength between the wiring board and the lid member. For example, in order to increase the bonding strength between the wiring board and the lid member, a wiring board having a recess portion on the upper face thereof is known in which in a frame-like portion (side wall portion) surrounding the recess portion, a groove having a V-shaped cross section (with its opening width being as large as the width of the side wall portion) is formed so as to extend over the entire width of the side wall portion from the outer end to the inner end (see, for example, Patent Literature 1).

Also, the size of wiring boards is decreasing with the recent growing demand for smaller electronic apparatuses. In order to efficiently produce a plurality of wiring boards having a reduced size, a technique is performed in which a plurality of wiring boards are produced by dividing a multiple patterning wiring board. The multiple patterning wiring board is a board in which a plurality of wiring board regions are arranged and formed in rows and columns in a center portion of a broad base substrate, the wiring board regions each serving as a wiring board after the base substrate is divided, and dividing grooves for dividing the wiring board regions are formed in rows and columns. By bending the base substrate to separate the individual wiring board regions along the dividing grooves, a plurality of wiring boards are obtained.

Some wiring boards are flat plate-shaped without a recess portion, and a lid member that has a recess portion and covers an electronic component mounted on the center portion of the wiring board is bonded to such a wiring board. In this case, in order to increase the bonding strength between the wiring board and the lid member, a method can be conceived in which, as in the case of the wiring board having a recess portion as described above, a groove having a V-shaped cross section (with its opening width being as large as a width between the electronic component mounting region and an outer edge of the wiring board) is formed so as to extend over the entire width between the electronic component mounting region and the outer edge of the wiring board.

CITATION LIST

Patent Literature

Patent Literature 1: Japanese Unexamined Patent Publication JP-A 2006-41456

SUMMARY OF INVENTION

Technical Problem

However, the method in which a multiple patterning wiring board having a groove for increasing the bonding strength to a lid member in each wiring board region is produced and divided along a dividing groove is problematic in that the multiple patterning wiring board is not properly divided along the dividing groove and as a result a burr or crack is likely to form in an outer edge portion of the resulting wiring boards. This is because, in the case where the groove for increasing the bonding strength to a lid member is formed in the same main face as the dividing groove at a depth deeper than the dividing groove, for example, the stress applied when dividing the base substrate tends to concentrate in the bottom of the groove, so that the base substrate is likely to be divided from the bottom of the groove, rather than the bottom of the dividing groove. Even if fractures form from the bottom of the dividing groove, the fractures tend to deviate toward the direction of the groove for increasing the bonding strength to a lid member while running from the bottom of the dividing groove to the opposing main face. Furthermore, because the opening width of the groove for increasing the bonding strength to a lid member is as large as the width between the electronic component mounting region and the outer edge of the wiring board, an angle between the outer edge of a divided wiring board and the groove will be acute, and thus this portion is likely to crack due to the wiring board bumping into another wiring board or the like.

When there is a burr or crack in the outer edge portion of a wiring board, the following problems arise: it is not possible to fill the groove for increasing the bonding strength to a lid member provided in the outer edge portion with a sealant and thus not possible to securely bond the wiring board and the lid member; and accurate mounting is not possible when an electronic component is mounted on the wiring board using the outer edge of the wiring board as a reference or when an electronic apparatus in which an electronic component is mounted on the wiring board is mounted on an external electrical circuit board using the outer edge of the electronic apparatus as a reference.

The invention has been conceived in view of the problems encountered with the related art as described above, and it is an object of the invention to provide a multiple patterning wiring board that can reduce burrs and cracks that form in wiring boards when the multiple patterning wiring board having a groove for bonding a lid member in one main face is divided. It is another object of the invention to provide a wiring board obtained from such a multiple patterning wiring board and an electronic apparatus including such a wiring board.

Solution to Problem

The invention provides a multiple patterning wiring board, comprising a base substrate comprising in one main surface thereof, a plurality of wiring board regions arranged in rows and columns, the wiring board regions each comprising an electronic component mounting region in a center portion thereof, a dividing groove at borders between the wiring board regions and, a region configured to bond a lid member which is formed between the electronic component mounting region and the dividing groove, wherein the lid member bonding region comprises a groove, the groove having a width less than or equal to a width of the electronic component mounting region and a depth less than a depth of the dividing groove.

Furthermore, in the multiple patterning board of the invention, it is preferable that the groove extends continuously along the dividing groove between adjacent two regions of the plurality of wiring board regions.

The invention provides a wiring board obtained by dividing the multiple patterning wiring board mentioned above along the dividing groove.

Further, the invention provides a wiring board obtained by dividing the multiple patterning wiring board mentioned above along the dividing groove, wherein the wiring board comprises, in the one main face, an electronic component mounting region, and a groove is located between the electronic component mounting region and an outer edge of the wiring board, and has both ends thereof extending to opposing sides.

The invention provides an electronic apparatus, comprising an electronic component mounted on the electronic component mounting region of the wiring board mentioned above and a lid member bonded so as to cover the electronic component.

Advantageous Effect of Invention

According to a multiple patterning wiring board of the invention, there is a region configured to bond a lid member which is formed between an electronic component mounting region and a dividing groove in one main face of a base substrate, and the lid member bonding region comprises a groove, the groove having a width less than or equal to the width of the electronic component mounting region and a depth less than the depth of the dividing groove. Therefore, the stress applied when dividing the base substrate by bending easily concentrates in the bottom of the dividing groove rather than the bottom of the groove, and as a result, a situation in which the base substrate is divided from the bottom of the groove can be suppressed. Further, the bottom of the dividing groove is located at a position deeper than the bottom of the groove and the bottom of the groove is not located between the bottom of the dividing groove and the other main face. Therefore, a situation is suppressed in which fractures forming from the bottom of the dividing groove deviate toward the groove while running toward the other main face. Accordingly, the base substrate can be properly divided along the dividing groove, and it is therefore possible to reduce the possibility of the formation of a burr or crack in the outer edge portion of the divided wiring boards.

Further, According to the multiple patterning wiring board of the invention, when the groove extends continuously along the dividing groove between adjacent two regions of the plurality of wiring board regions, the groove is linear extending over a plurality of wiring board regions. Therefore, the groove can be easily formed using a cutter blade or the like when the multiple patterning wiring board is produced, and the surface area of the groove at the corner of the upper face of a divided wiring board can be increased.

According to a wiring board of the invention, the wiring board is a wiring board obtained by dividing the multiple patterning wiring board of the above configuration along the dividing groove, and therefore the formation of a burr or crack at the outer edge portion of the wiring board is reduced and the opening width of the groove is smaller than the width between the electronic component mounting region and the outer edge of the wiring board, and as a result, a predetermined width can be secured between the outer edge of the divided wiring board and the groove, and this portion will not be easily cracked due to the wiring board bumping into another wiring board or the like. Accordingly, the outer edge of the wiring board can be easily recognized by an image recognition apparatus or the like and an electronic component can be mounted onto the wiring board using the outer edge of the wiring board as a reference with high positional accuracy.

Further, According to a wiring board of the invention, the wiring board is a wiring board obtained by dividing the multiple patterning wiring board of the above configuration along the dividing groove, wherein the wiring board comprises, comprising, in one main face, an electronic component mounting region, and a groove is located between the electronic component mounting region and an outer edge of the wiring board, and ends thereof extend to opposing sides. Therefore, the surface area of the groove at the corner of the wiring board as viewed from above can be increased, and the amount of sealant at the corner can be increased, and as a result, the bonding strength of the corner of the wiring board to a lid member can be increased.

According to an electronic apparatus of the invention, an electronic component is mounted on the electronic component mounting region of the wiring board having the above configuration and a lid member is bonded so as to cover the electronic component. Therefore, the formation of a burr or crack at the outer edge portion of the electronic apparatus is reduced, and the groove can be properly filled with a sealant, securely bonding the wiring board and the lid member, and as a result, the outer edge of the electronic apparatus can be easily recognized by an image recognition apparatus or the like, and the electronic apparatus can be mounted onto an external electrical circuit board using the outer edge of the electronic apparatus as a reference with high positional accuracy.

DESCRIPTION OF EMBODIMENTS

Figure 1:
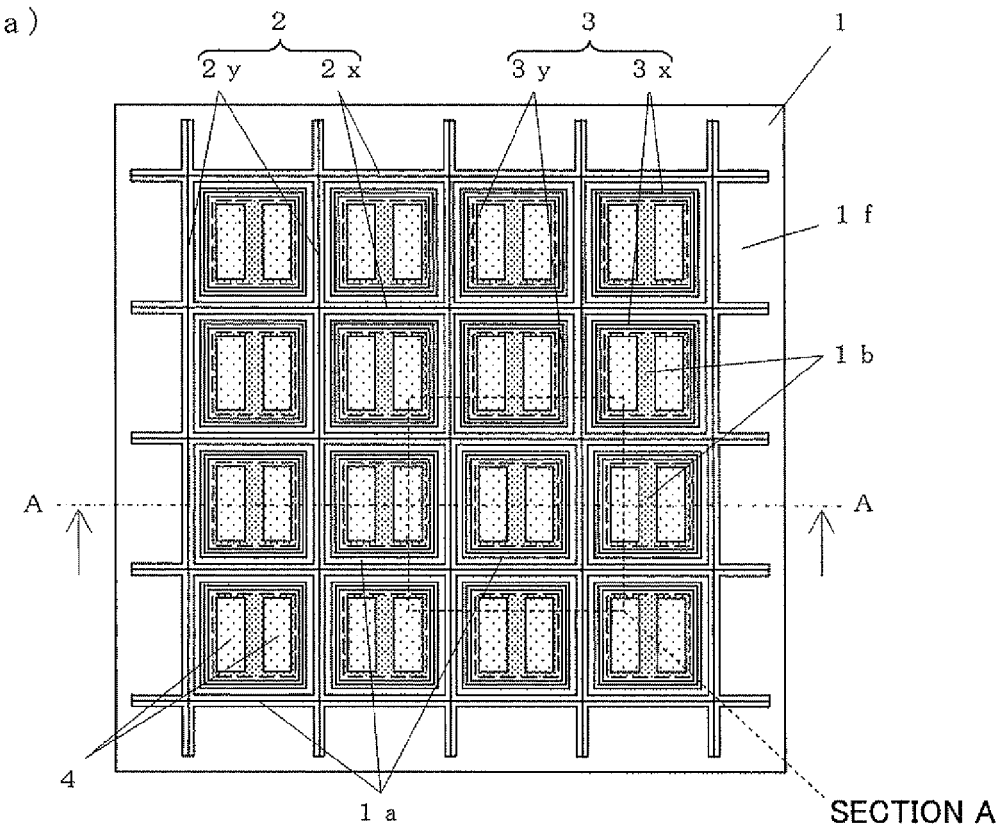
FIG. 1(*a*) is a plan view of a multiple patterning wiring board according to an embodiment of the invention, and FIG. 1(*b*) is a cross-sectional view taken along the line A-A of FIG. 1(*a*)
Figure 1:
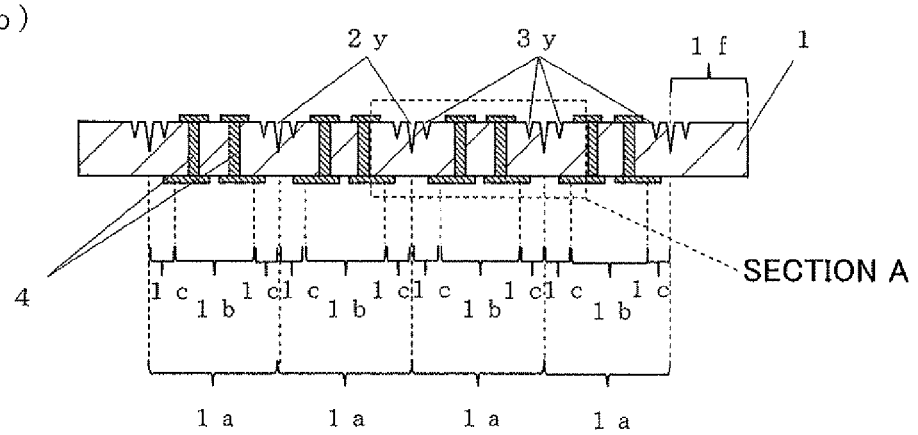

Multiple patterning wiring boards according to the invention will be described with reference to the accompanying drawings.

FIGS. 1 to 7 illustrate multiple patterning wiring boards according to embodiments of the invention. In these diagrams, reference numeral 1 denotes a base substrate, reference numeral 1a denotes a wiring board region, reference numeral 1b denotes an electronic component mounting region, reference numeral 1c denotes a lid member bonding region, reference numeral 1d denotes a second electronic component mounting region, reference numeral 2 (2x, 2y) denotes a dividing groove, reference numeral 2a (2ya) denotes a second dividing groove, reference numeral 3 (3x, 3y) denotes a groove, reference numeral 4 denotes a wiring conductor, and reference numeral 5 denotes a recess portion. Although FIGS. 2(a), 4(a) and 6(a) are shown in the plan views, the dividing grooves 2 (2x, 2y) and the grooves 3 (3x, 3y) are hatched for easy recognition.

In the examples shown in FIGS. 1(a), 3(a) and 5(a), a total of sixteen wiring board regions 1a are arranged in the base substrate 1, with four wiring board regions 1a in each row and column. Dividing grooves 2 including a vertical dividing groove 2y and a horizontal dividing groove 2x are formed at borders between wiring board regions 1a. Dummy regions if are provided in the periphery of a center portion where the sixteen wiring board regions 1a are arranged in rows and columns, and dividing grooves 2 are also formed at borders between the dummy regions if and the wiring board regions 1a.

As in the examples shown in FIGS. 1 to 6, the multiple patterning wiring board according to the invention comprises a base substrate 1 comprising in one main surface thereof, a plurality of wiring board regions 1a arranged in rows and columns, the wiring board regions 1a each comprising an electronic component mounting region 1b in a center portion thereof, a dividing groove 2 at borders between the wiring board regions 1a, and a region is configured to bond a lid member (not shown) which is formed between the electronic component mounting region 1b and the dividing groove 2, wherein the lid member bonding region is comprises grooves 3, the groove having a width less than a width of the region 1c and a depth d2 less than a depth d1 of the dividing groove 2.

Since the depth d2 of the groove 3 is less than the depth d1 of the dividing groove 2 (d2<d1), the stress applied when separating the individual wiring board regions 1a by bending the base substrate 1 easily concentrates in the bottom of the dividing groove 2 rather than the bottom of the groove 3, and therefore the base substrate 1 can be divided from the bottom of the dividing groove 2. Further, since the bottom of the dividing groove 2 is located at a position deeper than the bottom of the groove 3, the bottom of the groove 3 is not located at a position between the bottom of the dividing groove 2 and the other main face, and therefore a situation is suppressed in which fractures forming from the bottom of the dividing groove 2 deviate toward the groove 3 while running toward the other main face. Accordingly, the base substrate 1 can be properly divided into individual wiring board regions 1a along the dividing groove 2, and it is therefore possible to reduce the possibility of the formation of a burr or crack in the outer edge portion of the divided wiring boards.

Figure 5:
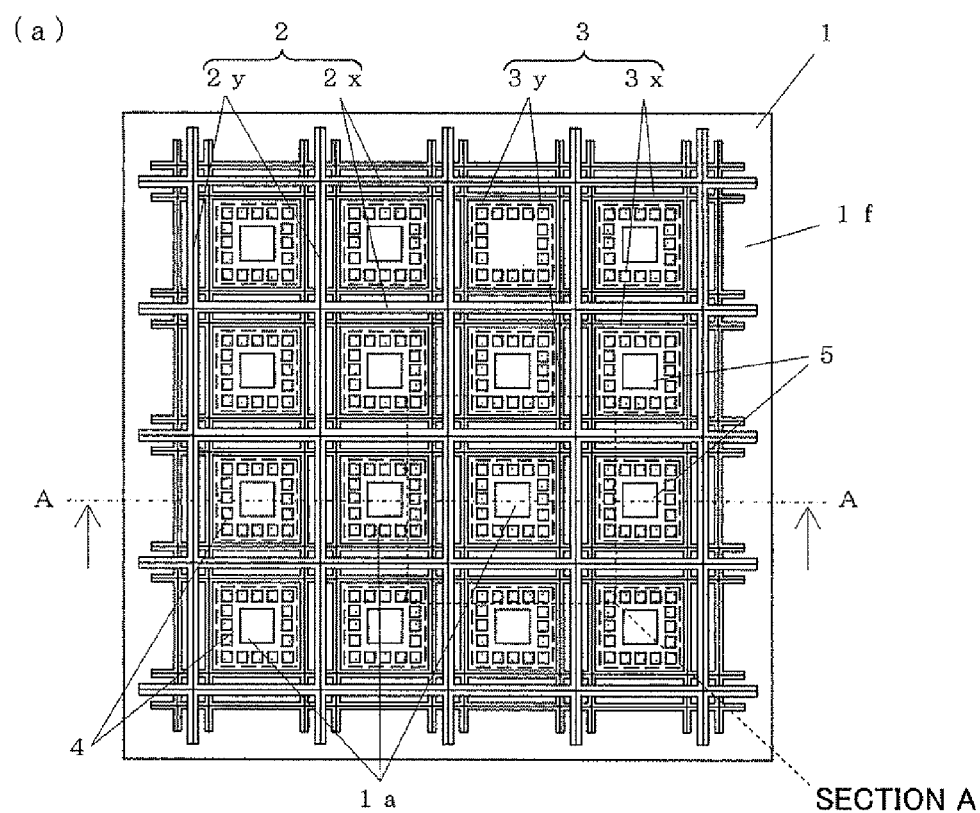
FIG. 5(a) is a plan view of a multiple patterning wiring board according to an embodiment of the invention.
FIG. 5(b) is a cross-sectional view taken along the line A-A of FIG. 5(a)
Figure 5:
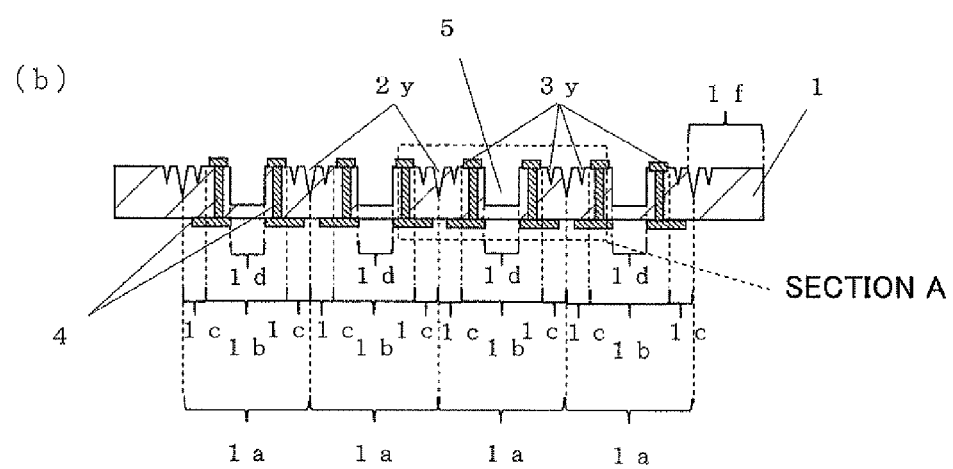
Figure 6:
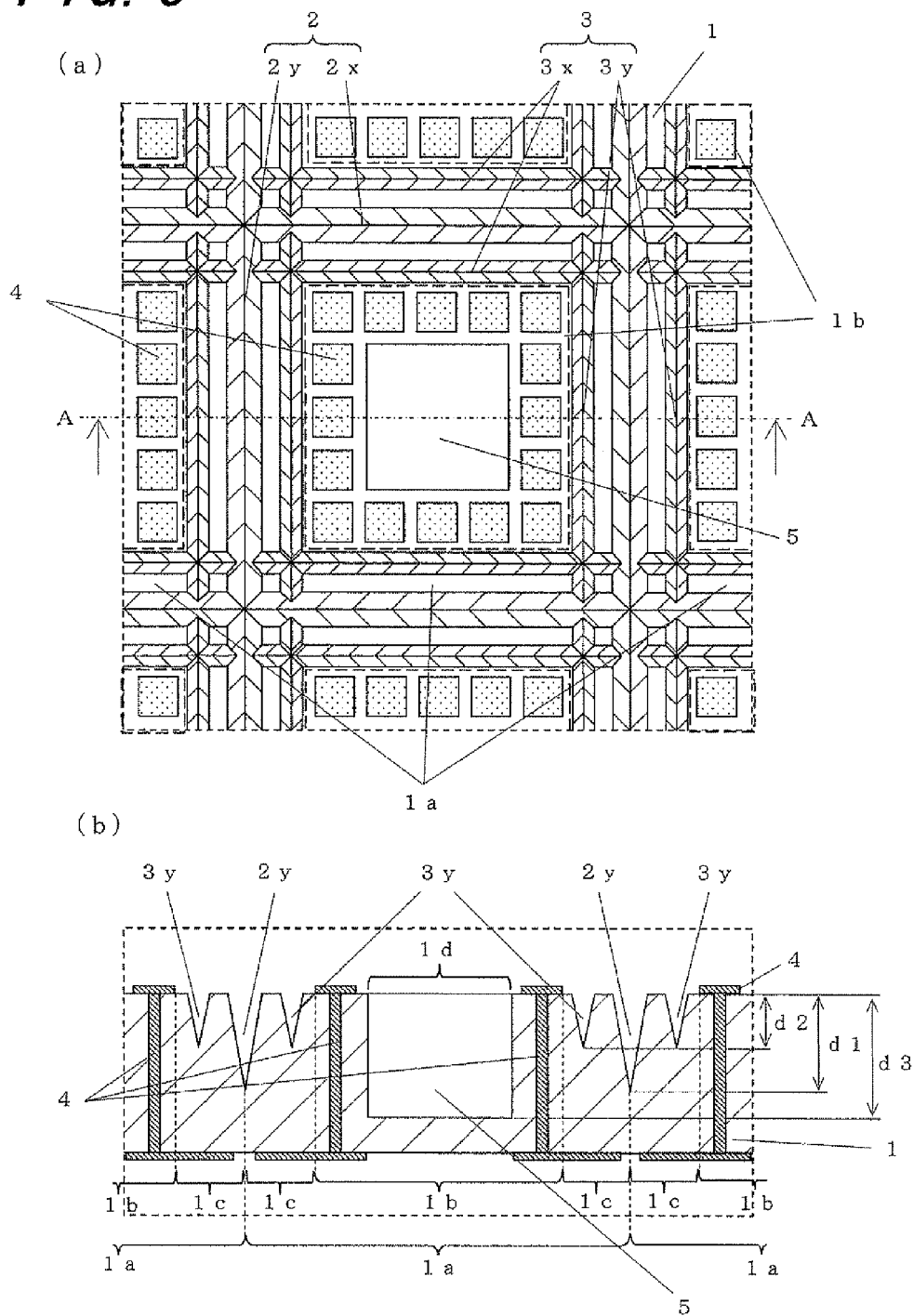
FIG. 6(a) is an enlarged cross sectional view of a section A shown in FIG. 5(a)
FIG. 6(b) is an enlarged cross-sectional view of the section A shown in FIG. 5(b)

Further, in the multiple patterning wiring board of the invention, as in the example shown in FIGS. 5 and 6, it is preferable that the groove 3 extends continuously along either the vertical dividing groove 2 or the horizontal dividing groove 2 of the base substrate 1 between adjacent two regions of the plurality of wiring board regions 1a. With this configuration, the groove 3 is linear extending over a plurality of wiring board regions 1a, and therefore the groove 3 can be easily formed using a cutter blade or by dicing or the like when the multiple patterning wiring board is produced, and the surface area of the groove 3 at the corner of the upper face of a divided wiring board can be increased.

The base substrate 1 comprises, for example, a plurality of wiring board regions 1a arranged in rows and columns in a center portion of an electrically insulating base body made of an aluminum oxide sintered body, a mullite sintered body, an aluminum nitride sintered body, a silicon carbide sintered body, a silicon nitride sintered body or a ceramic material such as glass ceramics, the wiring board regions 1a each comprising a wiring conductor 4 comprising a metallized conductor containing a metal powder such as tungsten, molybdenum, copper or silver formed therein.

In the case where the insulating base body is made of an aluminum oxide sintered body, for example, the base substrate 1 is produced as follows. A ceramic slurry obtained by mixing a ceramic raw material powder such as aluminum oxide, silicon oxide, magnesium oxide or calcium oxide with an appropriate organic binder, solvent, plasticizer, dispersing agent and the like is formed into a sheet by using a conventionally known sheet forming method such as a doctor blade method to give a ceramic green sheet. After that, the ceramic green sheet is appropriately punched. Where necessary, a plurality of punched ceramic green sheets are stacked to produce a green formed product that will serve as the base substrate 1. The green formed product is fired at a temperature of approximately 1500 to 1800° C. In this manner, a base substrate composed of a single or a plurality of insulating layers is produced.

The wiring conductor 4 comprises a wiring conductor layer disposed on the surface of the insulating base body or between insulating layers and a through conductor that passes through the insulating layers to electrically connect the wiring conductor layers located above and below the through conductor. The wiring conductor layer is formed by printing/applying a metallized paste for forming the wiring conductor layer onto the ceramic green sheet for forming the base substrate 1 by printing means such as a screen printing method and firing the paste together with the green formed product that will serve as the base substrate 1. The through conductor is formed by, prior to printing/applying the metallized paste for forming the wiring conductor, forming a through hole for forming the through conductor in the ceramic green sheet for forming the base substrate 1 by a processing method such as punching using a cast or punch or laser processing, filling the through hole with a metallized paste for forming the through conductor by printing means such as a screen printing method, and firing the paste together with the green formed product that will serve as the base substrate 1. The metallized paste is produced by adding an organic binder, an organic solvent, optionally a dispersing agent and the like to a metal powder as a main component and mixing and kneading these components by kneading means such as a ball mill, three-roll mill or planetary mixer. A glass or ceramic powder may be added according to the sintering behavior of the ceramic green sheet or in order to increase the bonding strength to the base substrate after firing. The metallized paste for forming the through conductor is adjusted by the type or amount of organic binder or organic solvent that is added so as to have a viscosity suitable for filling, generally, a viscosity higher than that of the metallized paste for forming the wiring conductor layer.

An exposed surface of the wiring conductor 4 is coated with a metal having excellent corrosion resistance such as nickel or gold as necessary. It is thereby possible to effectively suppress corrosion of the wiring conductor 4, as well as securing the bonding between the wiring conductor 4 and an electronic component, the bonding between the wiring conductor 4 and a bonding wire and the bonding between the wiring conductor 4 and a wiring conductor of an external electrical circuit board. The exposed surface of the wiring conductor 4 may be coated with, for example, a nickel plating layer having a thickness of about 1 to 10 μm and a gold plating layer having a thickness of about 0.1 to 3 μm that are formed in sequence by an electrolytic plating method or electroless plating method.

The dividing groove 2 is formed at borders between wiring board regions 1a in one main face of the base substrate 1. The vertical cross-section of the dividing groove 2 may be V-shaped, U-shaped or rectangular. However, when the dividing groove 2 has a V-shaped vertical cross-section as in the examples shown in FIGS. 1 to 7, the bottom of the dividing groove 2 has a shape in which stress is easily concentrated when the base substrate 1 is broken along the dividing groove 2 by bending, and therefore the base substrate 1 can be broken with ease and accuracy.

Figure 7:
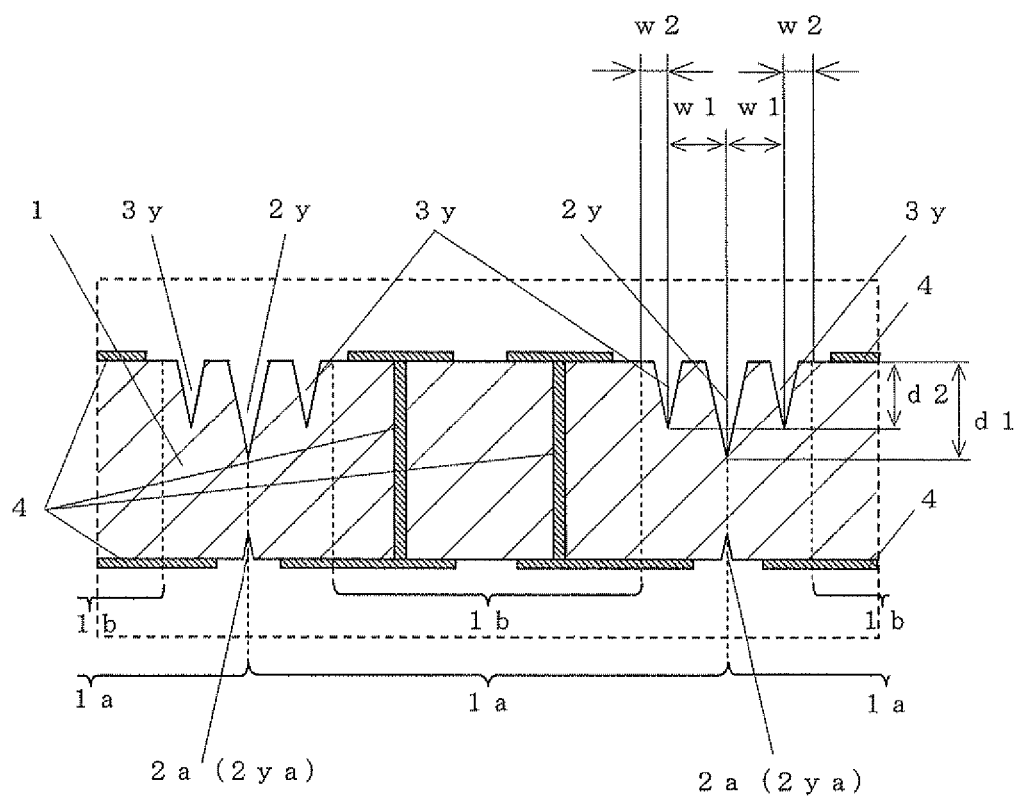
FIG. 7 is an enlarged cross-sectional of a relevant part of a multiple patterning wiring board according to another embodiment of the invention.

Further, as in the example shown in FIG. 7, it is preferable to form a second dividing groove 2a (2ya in the vertical direction of FIG. 7) at borders between wiring board regions 1a in the other main face of the base substrate 1. By forming the second dividing groove 2a as described above, fractures also form from the bottom of the second dividing groove 2a on the other main face side, and it is therefore possible to divide the base substrate 1 along the borders between wiring board regions 1a from the two main faces with high accuracy.

In the case where the second dividing groove 2a is provided in the other main face, the bottom of the dividing groove 2 on one main face side is located at a position that is deeper than the bottom of the groove 3 and near the bottom of the second dividing groove 2a on the other main face side, and therefore fractures will easily run from the bottom of the second dividing groove 2a on the other main face side toward the bottom of the dividing groove 2 on one main face side that is opposite to the other main face. In the manufacturing process of a multiple patterning wiring board for obtaining multilayer wiring boards, a positional offset of about several tens to several hundreds of micrometers can occur between the dividing groove 2 on one main face side and the second dividing groove 2a on the other main face side. However, when the groove 3 is provided at a position that is spaced apart from the dividing groove 2 on one main face side and is closer to the electronic component mounting region 1b, the second dividing groove 2a and the groove 3 are far apart from each other, and therefore progression of fracturing from the second dividing groove 2a toward the groove 3 is suppressed, and the possibility of the formation of a burr or crack in the outer edge portion of the wiring board can be reduced. In the case where a recess portion 5 is provided on one main face side, the groove 3 is preferably provided at a position closer to the recess portion 5, rather than a position closer to the dividing groove 2 for the same reason described above.

The depth of the dividing groove 2 is set as appropriate according to the material or the like of the insulating base body, and the dividing groove 2 is formed to have a depth that is about 50 to 70% of the thickness of the base substrate 1. By doing so, it is possible to obtain a multiple patterning wiring board in which the base substrate 1 can be properly divided and which can be prevented from inadvertent fracturing. In the case where the second dividing groove 2a is formed in the other main face of the base substrate 1, the second dividing groove 2a is formed such that the total depth of the dividing groove 2 and the second dividing groove 2a will be the above-described percentage of the thickness of the base substrate 1.

It is preferable that the dividing groove 2 in one main face of the base substrate 1 has an opening width of about 0.05 to 1.0 mm. When the opening width of the dividing groove 2 falls within this range, the base substrate 1 can be properly divided. Further, the size of the wiring board regions 1a is not reduced by the influence of the surface area occupied by the dividing groove 2, and the wiring board regions 1a are not deformed significantly when the dividing groove 2 is formed.

Figure 2:
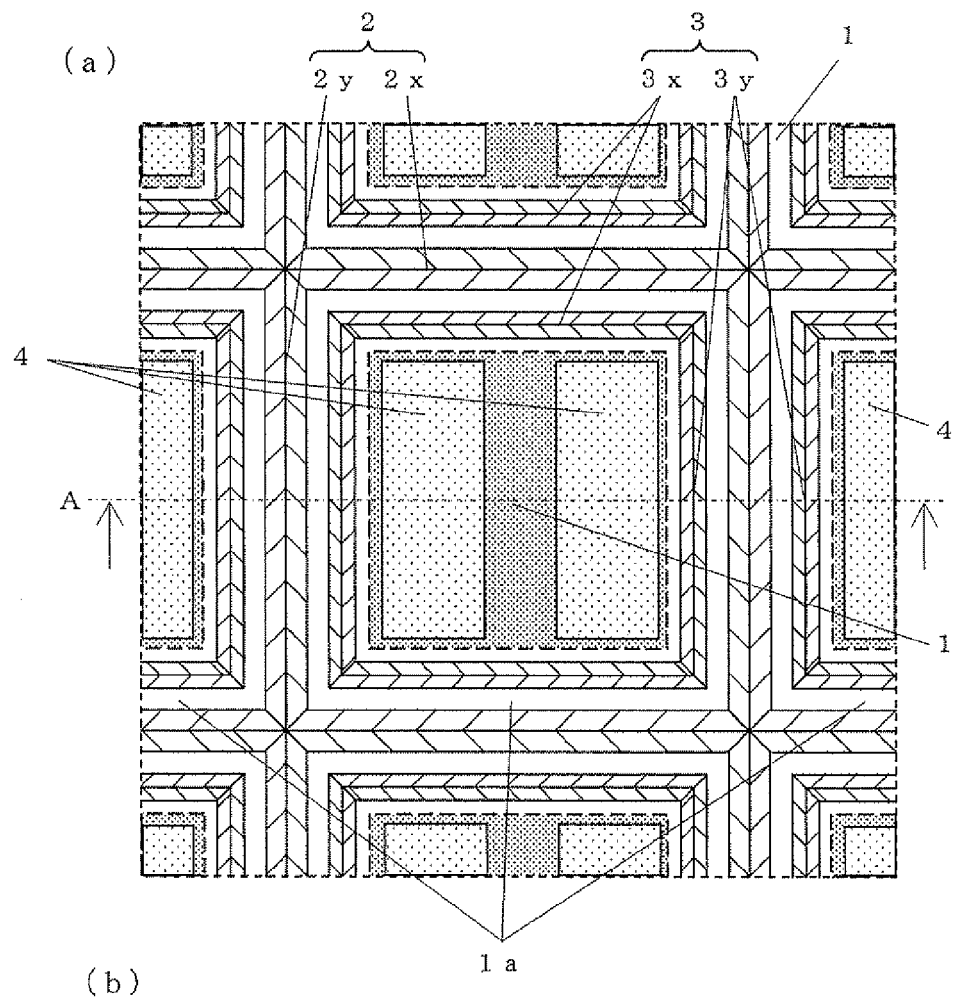
FIG. 2(a) is an enlarged plan view of a section A shown in FIG. 1(a)
FIG. 2(b) is an enlarged cross-sectional view of the section A shown in FIG. 1(b)
Figure 2:
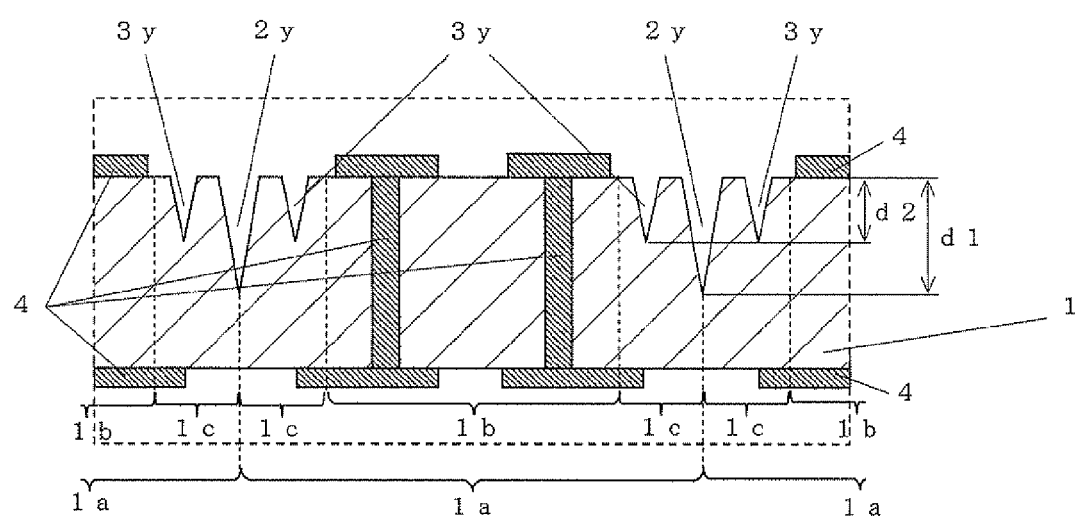

The groove 3 is formed in the lid member bonding region 1c between the dividing groove 2 and the electronic component mounting region 1b in one main face of the base substrate 1. In the example shown in FIGS. 1 and 2, the groove 3 has a rectangular frame-like shape surrounding the electronic component mounting region 1b. In the example shown in FIGS. 5 and 6, the groove 3 has a shape extending along either the vertical dividing groove 2 or the horizontal dividing groove 2 of the base substrate 1 (a vertical groove 3 has a shape extending along the vertical dividing groove 2 and a horizontal groove 3 has a shape extending along the horizontal dividing groove 2), and is continuous between adjacent wiring board regions 1a. In the examples shown in FIGS. 1 to 6, as shown in FIGS. 2(b), 4(b) and 6(b), the depth d2 of the groove 3 is set to be smaller than the depth d1 of the dividing groove 2, and the groove 3 is formed to have a depth that is about 10 to 40% of the thickness of the base substrate 1. The groove 3 has a cross section having a shape as in the examples shown in FIGS. 1 to 6. In the case where the groove 3 is formed using a cutter blade, the bottom of the groove 3 has a V-shaped vertical cross section, but it may be U-shaped or rectangular. In order to reduce the occurrence of fracturing in the bottom of the groove 3 when the base substrate 1 is divided, it is preferable to form the groove 3 to have a shape in which the stress does not easily concentrate in the bottom, such as a U shape or round rectangular shape having round corners. Such a shape can be obtained by forming the groove 3 using a laser.

Further, it is preferable that in the case where the groove 3 has a V-shaped cross section, the bottom angle is larger than the bottom angle of the dividing groove 2. In order to suppress a situation in which the base substrate 1 is divided from the bottom of the groove 3 and to facilitate filling of the groove 3 with a sealant when a lid member is bonded to the wiring board, the bottom angle of the groove 3 is set to, for example, about 20 degrees to 90 degrees.

Further, it is preferable that the base substrate 1 has dummy regions 1f in the periphery of a center portion in which a plurality of wiring board regions 1a are arranged in rows and columns. The dummy region 1f is a region for facilitating manufacturing and transportation of the multiple patterning wiring board. Positioning, fixation and the like can be performed using the dummy region 1f during processing or transportation of the green formed product which will serve as the base substrate 1 or the multiple patterning wiring board. Further, it is preferable that end portions of the dividing groove 2 are located in the dummy region 1f between the outermost wiring board region 1a and the periphery of the green formed product which will serve as the base substrate 1. With this configuration, it is possible to prevent inadvertent fracturing of the base substrate 1 by an external force applied during transportation of the base substrate 1. The dummy region may be provided between a plurality of wiring board regions 1a. In this case, the dividing groove 2 is formed between the wiring board region 1a and the dummy region.

Further, it is preferable that grooves 3 are symmetrically provided with respect to a dividing groove 2, or in other words, it is preferable that as in the example shown in FIG. 7, distances w1 between a pair of grooves 3 provided on opposing sides of a dividing groove 2 and the dividing groove 2 are the same. With this configuration, the distance w1 from the dividing groove 2 to the groove 3 is substantially equal on both sides of the dividing groove 2, and therefore when the base substrate 1 is divided along the dividing groove 2, the stress is applied substantially equally to both sides of the dividing groove 2, and as a result, it is possible to further reduce the possibility of the formation of a burr or crack in the outer edge portion of the wiring boards. In the case where a dummy region 1f is formed in the periphery of a wiring board region 1a, it is preferable that a groove 3 is also formed in the dummy region 1f, and the groove 3 formed in the wiring board region 1a and the groove 3 formed in the dummy region 1f are symmetrically provided with respect to the dividing groove 2. Further, it is preferable that the distance w1 between the dividing groove 2 and the groove 3 is larger than the distance between the electronic component mounting region 1b and the groove 3 (w2 shown in FIG. 7) (w1>w2). With this configuration, even when the fulcrum of the dividing groove 2 is shifted, the groove 3 is provided at a position that is spaced apart from the dividing groove 2 and is closer to the electronic component mounting region 1b. Therefore, division from the bottom of the groove 3 can be suppressed, and the possibility of the formation of a burr or crack in the outer edge portion of the divided wiring boards can be reduced.

Figure 14:
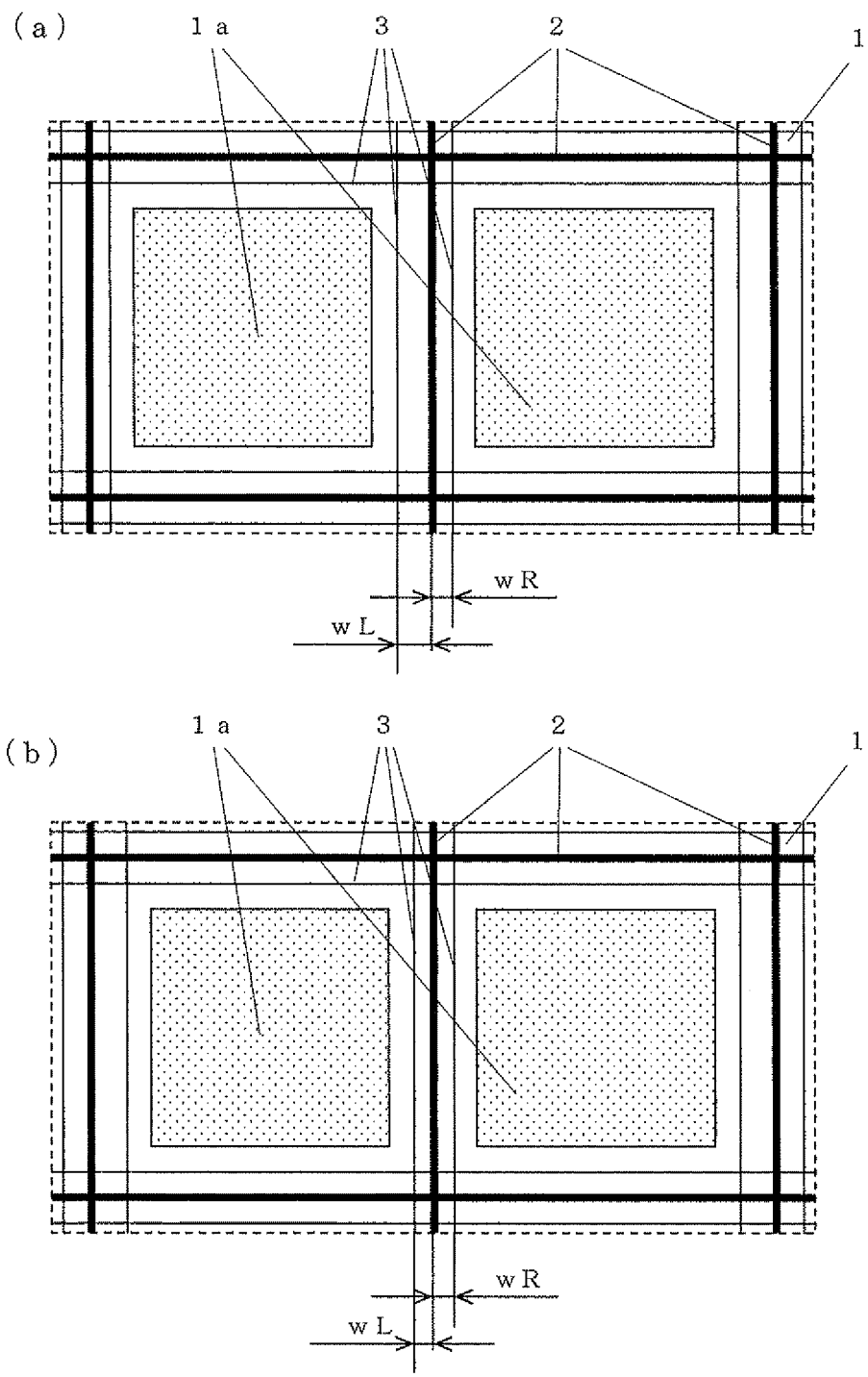
FIGS. 14(a) and 14(b) are plan views of a relevant part of a multiple patterning wiring board according to an embodiment of the invention.

In the case where the electronic component mounting region 1b is provided at a position out of alignment with the center of a wiring board region 1a as well, it is preferable that distances w1 between a pair of grooves 3 provided on opposing sides of a dividing groove 2 and the dividing groove 2 are the same. FIGS. 14(a) and 14(b) are plan views of a relevant part of a multiple patterning wiring board according to an embodiment of the invention.

In the case where a lid member having a shape that conforms to the shape of the wiring board region 1a is bonded, as in the example shown in FIG. 14(a), the lid member bonding region 1c and the groove 3 are out of alignment by an amount corresponding to the amount by which the electronic component mounting region 1b is out of alignment with the center of the wiring board region 1a, and thus the distances between the dividing groove 2 and the respective grooves 3 become different (wL>wR), and as a result, when the base substrate 1 is divided along the dividing groove 2, the stress is not equally applied to both sides of the dividing groove 2. In such a case, as in the example shown in FIG. 14(b), by disposing the electronic component mounting regions 1b at symmetrical positions with respect to a single dividing groove 3, the distances between respective grooves 3 and the dividing groove 2 can be made the same (wL=wR), and therefore the stress can be applied substantially equally to both sides of the dividing groove 2, and the possibility of the formation of a burr or crack in the outer edge portion of the divided wiring boards can be further reduced.

The dividing groove 2 and the groove 3 can be formed by pressing a cutter blade or cast against the green formed product which will serve as the base substrate 1 or by subjecting the green formed product which will serve as the base substrate 1 or the fired base substrate 1 to laser processing or dicing processing.

Figure 3:
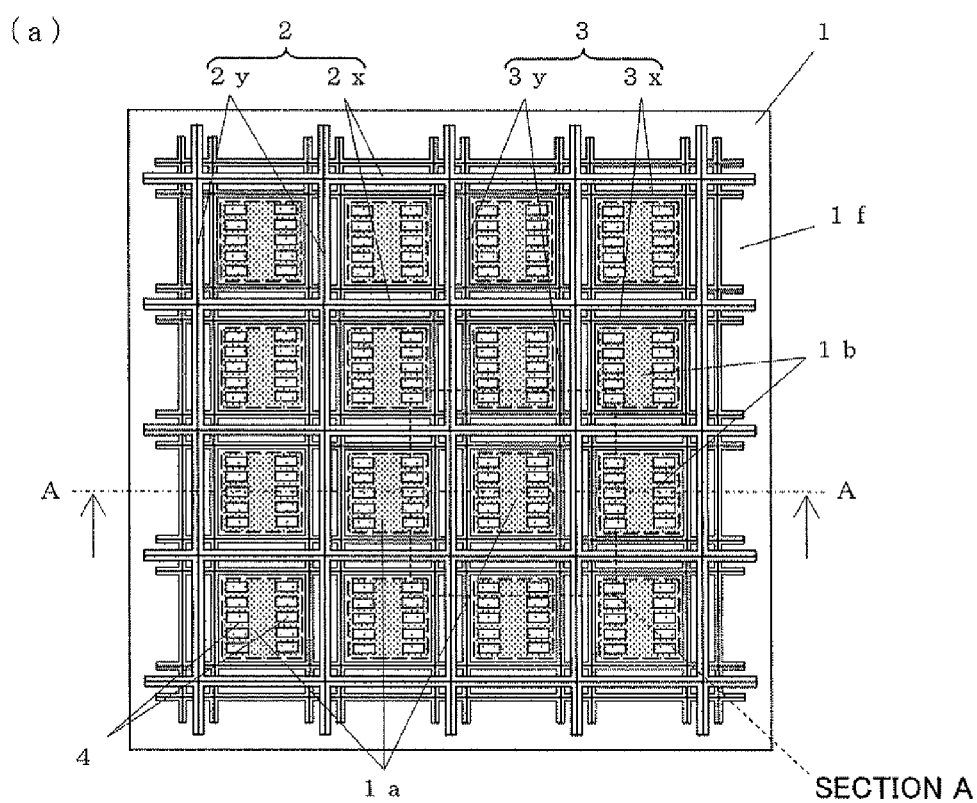
FIG. 3(a) is a plan view of a multiple patterning wiring board according to an embodiment of the invention.
FIG. 3(b) is a cross-sectional view taken along the line A-A of FIG. 3(a)
Figure 3:
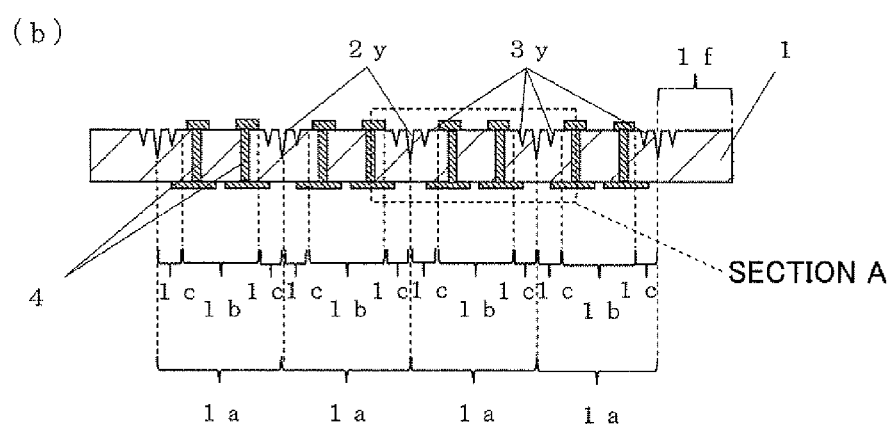
Figure 4:
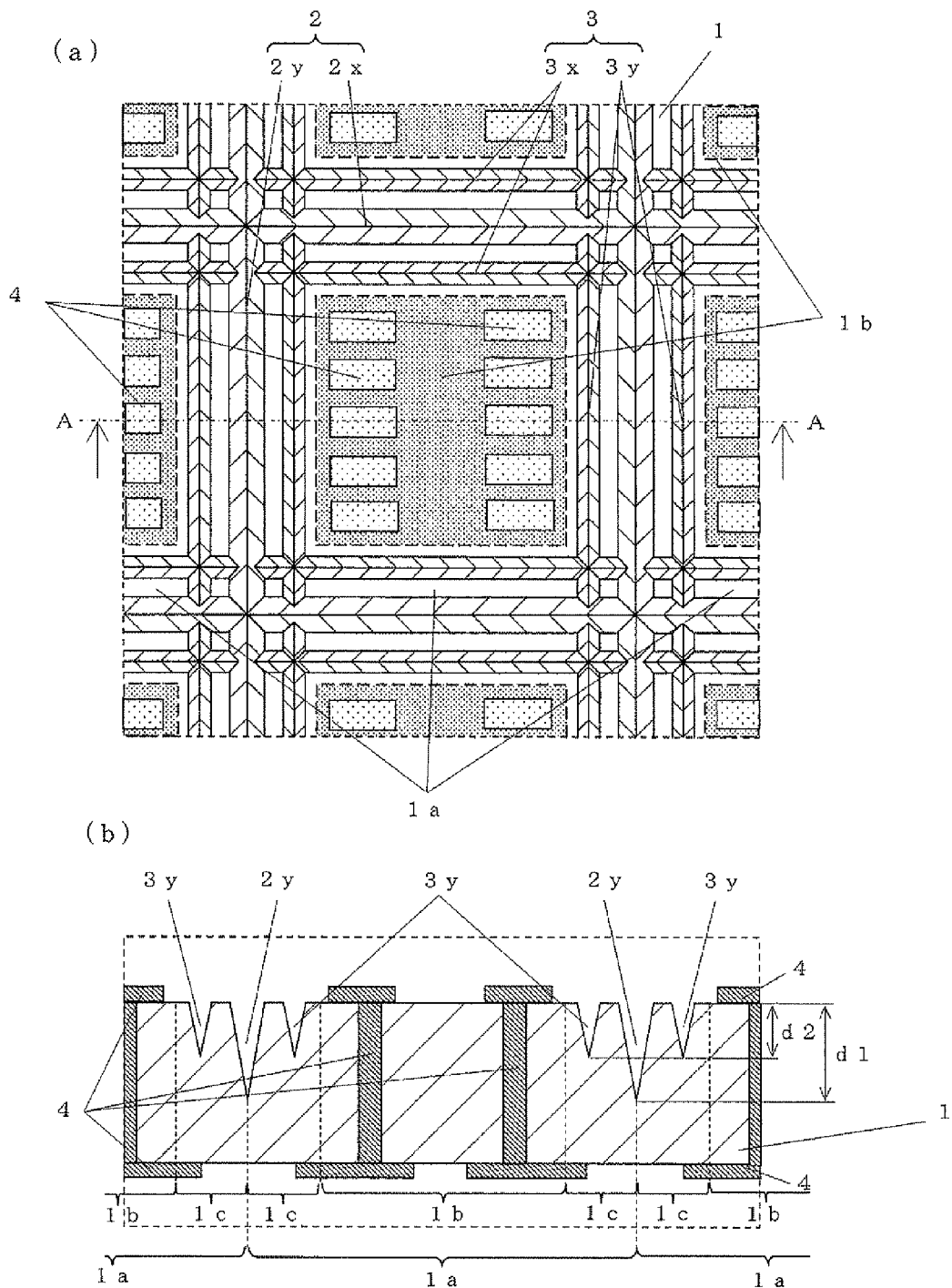
FIG. 4(a) is an enlarged cross sectional view of a section A shown in FIG. 3(a)
FIG. 4(b) is an enlarged cross-sectional view of the section A shown in FIG. 3(b)

FIGS. 8 to 11 are enlarged cross-sectional views showing examples of a process for manufacturing the multiple patterning wiring board shown in FIGS. 3 and 4. In FIGS. 8 to 11, reference numeral 1' denotes a green formed product that will serve as a base substrate 1, reference numeral 2y' denotes a notch that is formed in the green formed product 1' and will serve as a dividing groove 2y, reference numeral 3y' denotes a notch that is formed in the green formed product 1' and will serve as a groove 3y, reference numeral 4' denotes a metallized paste that will serve as a wiring conductor 4, reference numeral 6 denotes a cutter blade for forming the notch 2y', and reference numeral 7 denotes a cutter blade for forming the notch 3y'. FIGS. 8 to 11 show a step of forming the notch 2y' which will serve as the dividing groove 2y and the notch 3y' which will serve as the groove 3y in the green formed product 1' with the cutter blades 6 and 7 in the process for manufacturing a multiple patterning wiring board of the invention as in the example shown in FIGS. 3 and 4.

The dividing groove 2 and the groove 3 are formed as follows, for example. First, as shown in FIG. 8(a), the green formed product 1' is prepared, and thereafter, the cutter blade 6 is pressed against the green formed product 1' which will serve as the base substrate 1 to form a notch 2y' which will serve as a dividing groove 2y. After that, as in the example shown in FIGS. 8(b) and 8(c), the cutter blade 7 is pressed against the green formed product 1' which will serve as the base substrate 1 to form a notch 3y' which will serve as a groove 3y. Then, the green formed product 1' is fired, whereby a base substrate 1 having a dividing groove 2y and a groove 3y is obtained. Note that, horizontal dividing grooves 2x and horizontal grooves 3x are formed in the same manner as the vertical dividing grooves 2y and the vertical grooves 3y are formed.

Figure 8:
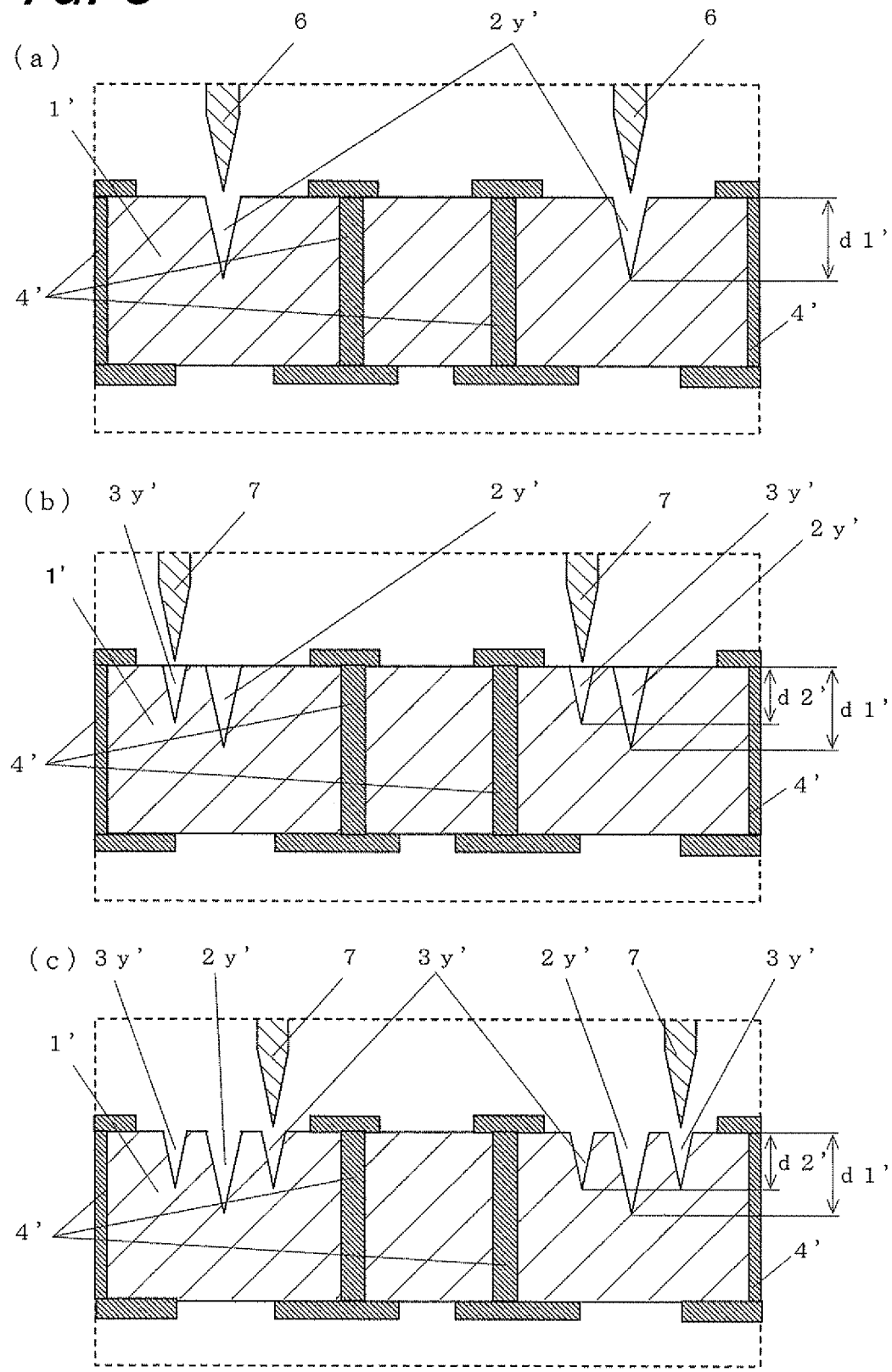
FIGS. 8(a) to 8(c) are cross-sectional views showing an example of a process for manufacturing a multiple patterning wiring board according to the invention.
Figure 9:
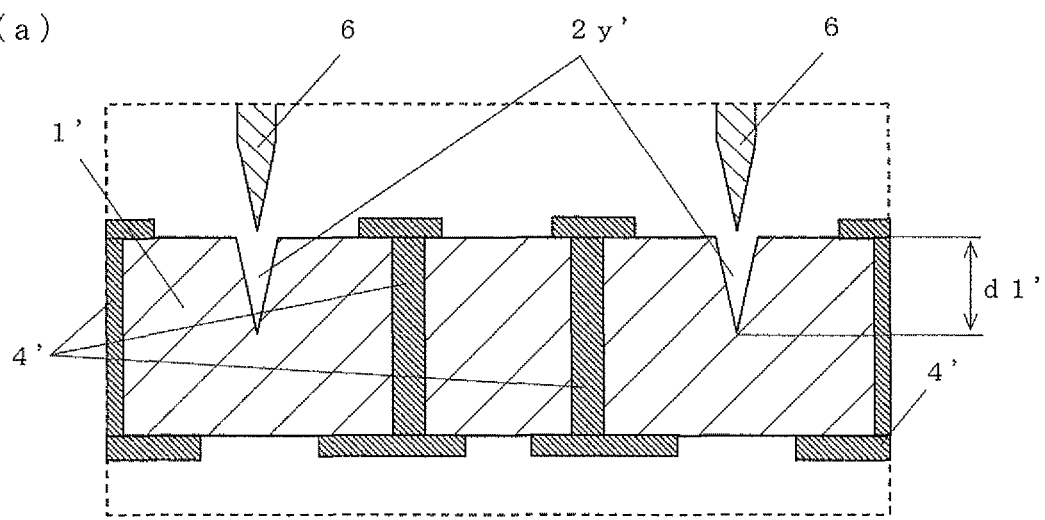
FIGS. 9(a) and 9(b) are cross-sectional views showing another example of a process for manufacturing a multiple patterning wiring board according to the invention.
Figure 9:
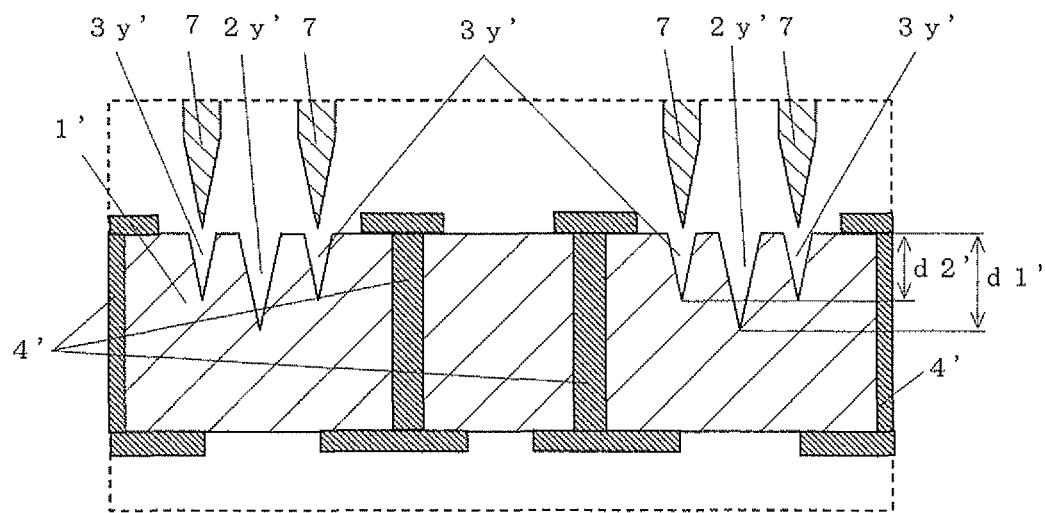

In the example shown in FIG. 8, notches 3y' provided on both sides of a notch 2y' are formed in two steps, but as in the example shown in FIG. 9, the notches 3y' on both sides of a notch 2y' may be formed simultaneously. By simultaneously forming the notches 3y', the notch 3y' forming step can be simplified, and it is possible to reduce deformation of the green formed product 1', deformation of the notch 2y' and the notch 3y' and the like, and thus the dividing groove 2y and the groove 3y can be formed with high accuracy. In this case, an integrated cutter blade having two cutter blades 7 may be used. Since such a cutter blade is thick as a whole, it is possible to reduce a situation in which the cutter blade 7 is deformed due to the stress applied when the notch 3y' is formed and as a result the depth, inclination or the like of the notch 3y' are changed as compared to the case where the notches 3y' are formed in two steps using a single thin cutter blade 7. Such a cutter blade can be easily produced by, for example, bonding two cutter blades 7 together.

Figure 10:
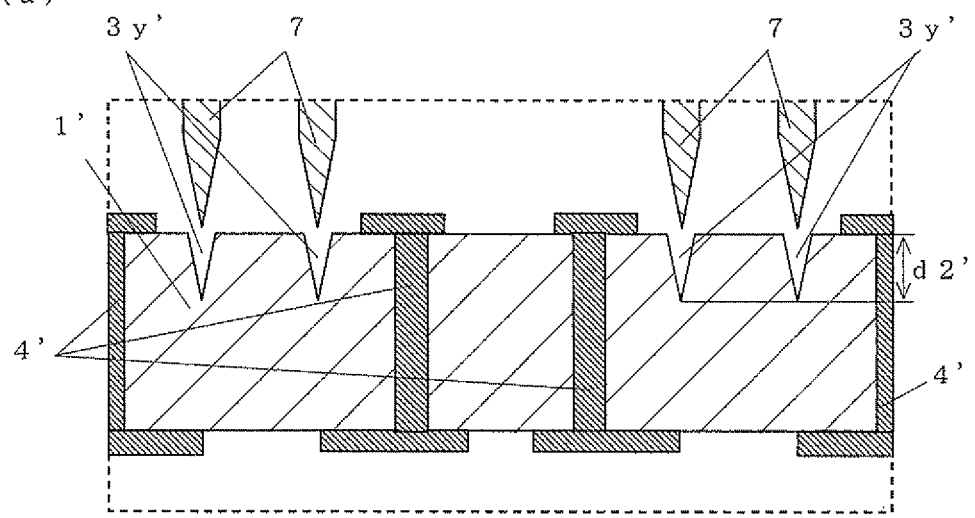
FIGS. 10(a) and 10(b) are cross-sectional views showing another example of a process for manufacturing a multiple patterning wiring board according to the invention.
Figure 10:
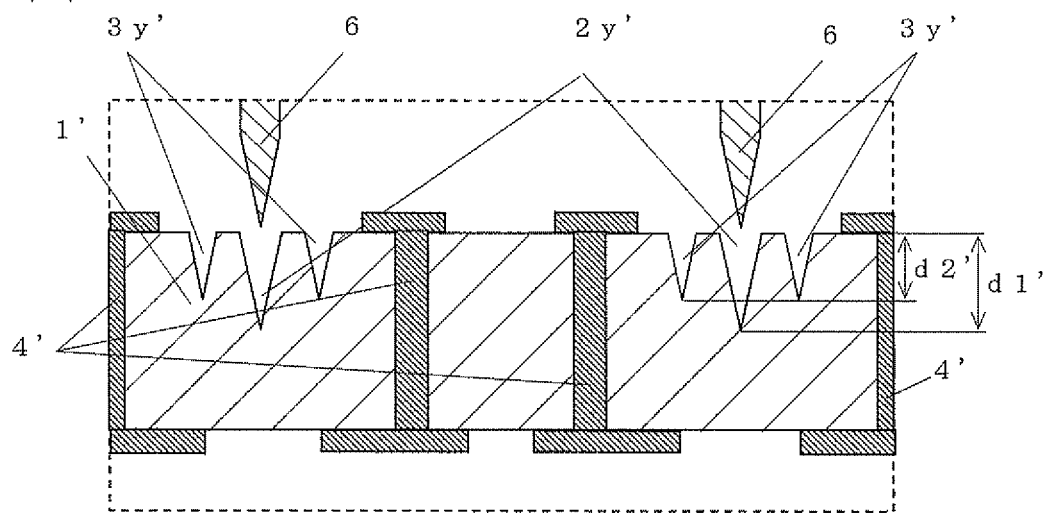
Figure 11:
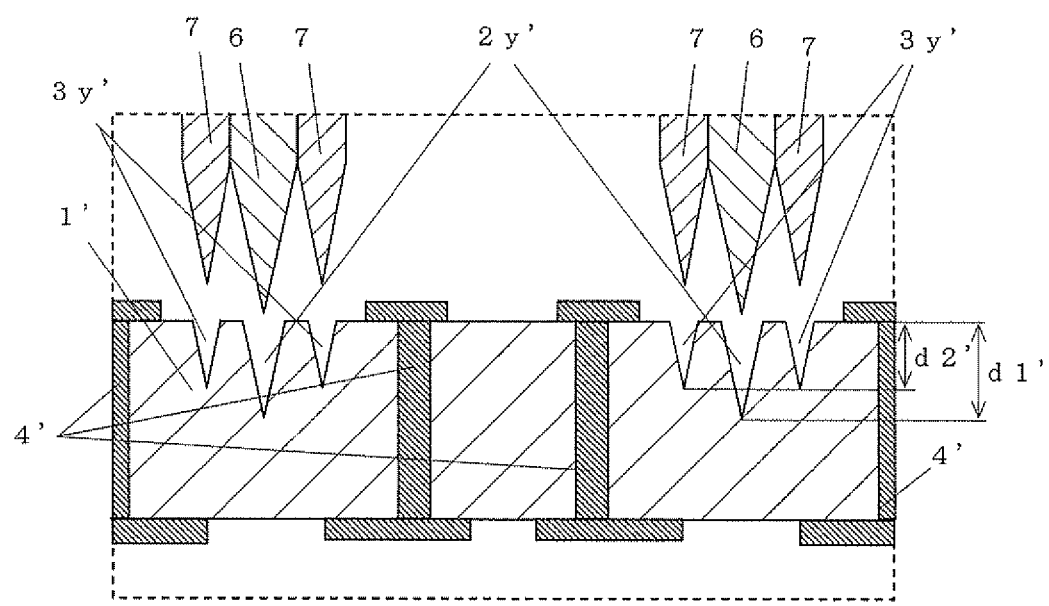
FIG. 11 is a cross-sectional view showing another example of a process for manufacturing a multiple patterning wiring board according to the invention.

Further, in the example shown in FIGS. 8 and 9, the notches 3' are formed after the notches 2' have been formed in the green formed product 1', but as in the example shown in FIG. 10, the notches 2' may be formed after the notches 3' have been formed in the green formed product 1'. Alternatively, as in the example shown in FIG. 11, the notches 2' and the notches 3' may be formed simultaneously. In this case, the notches 2' and the notches 3' may be formed simultaneously using an integrated cutter blade having a cutter blade 6 for forming the notch 2' and cutter blades 7 for forming the notches 3'. By simultaneously forming the notches 2' and the notches 3', the step of forming the notches 2' and the notches 3' can be simplified, and it is possible to control the distance w1 between the dividing groove 2 and the groove 3 with high accuracy.

In the case where the notches 3y' are formed after the notches 2y' have been formed in the green formed product 1' as in the example shown in FIGS. 8 and 9, it is possible to suppress a situation in which the width and depth of the notches 3' are reduced due to deformation of the green formed product 1' by the stress applied when the notches 2' having a greater depth are formed, and the width and depth of the grooves 3y can be controlled with high accuracy, as compared to the case where the notches 3y' are formed first. Since the notches 3y' are formed to have a depth less than that of the notches 2y', deformation of the green formed product 1' that occurs when the notches 3y' are formed is smaller than that when the notches 2y' are formed, and thus a situation is suppressed in which the depth of the notches 2' is reduced due to deformation of the green formed product 1'. In the case where a recess portion 5' is provided in the electronic component mounting region 1b, the stress applied when a notch 3y' which will serve as a groove 3y is distributed to the recess portion 5' side and the notch 2y' side which will serve as a dividing groove 2y, and it is therefore possible to suppress a situation in which the shape of the recess portion 5' is reduced due to deformation of the green formed product 1' caused by forming the notch 3y' which will serve as a groove 3y.

Further, a vertical notch 3' and a horizontal notch 3' (3x' and 3y') which will serve as grooves 3 (3x and 3y) may be formed after a notch 2y' which will serve as a vertical dividing groove 2y and a notch 2x' which will serve as a horizontal dividing groove 2x have been formed.

Figure 12:
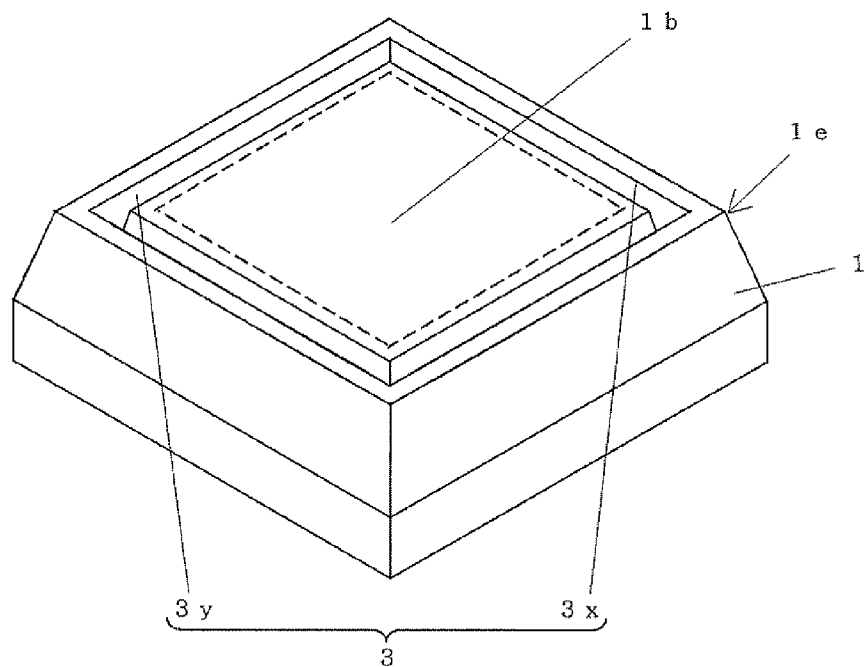
FIG. 12(a) is a perspective view of a wiring board according to an embodiment of the invention.
FIG. 12(b) is a cross-sectional view of an electronic apparatus according to an embodiment of the invention.
Figure 12:
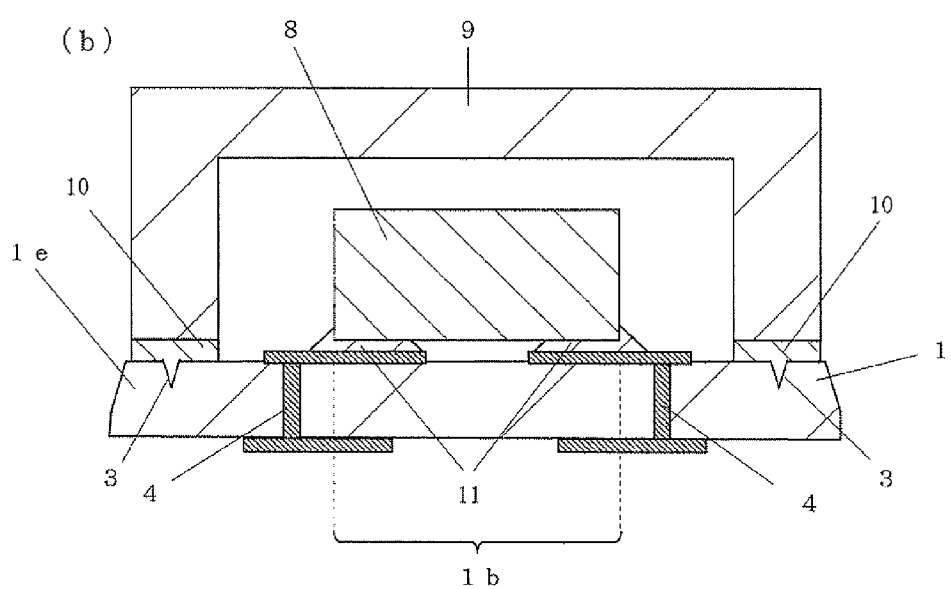
Figure 13:
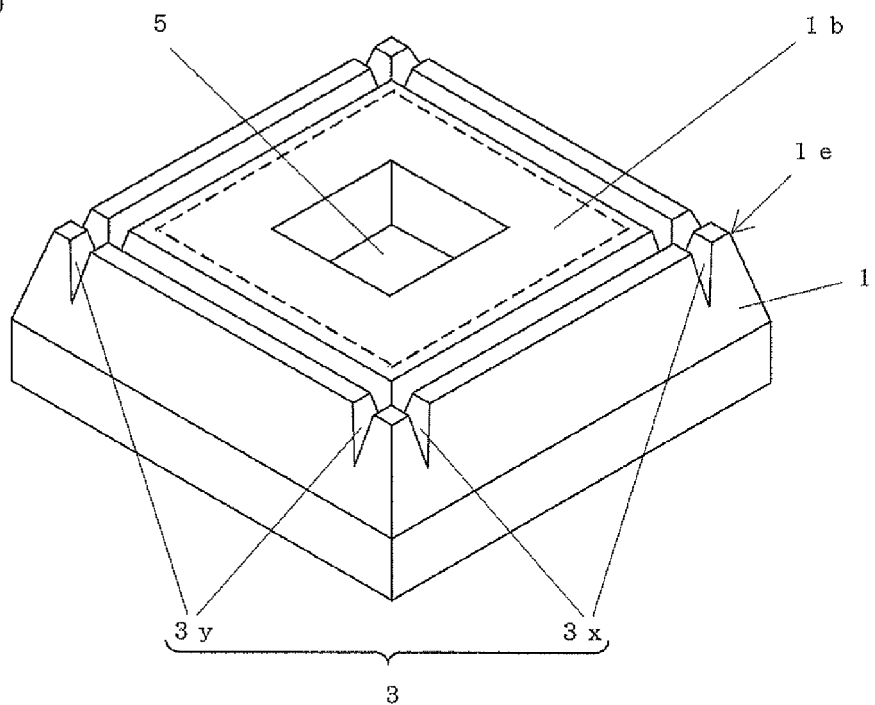
FIG. 13(a) is a perspective view of a wiring board according to an embodiment of the invention.
FIG. 13(b) is a cross-sectional view of an electronic apparatus according to an embodiment of the invention.
Figure 13:
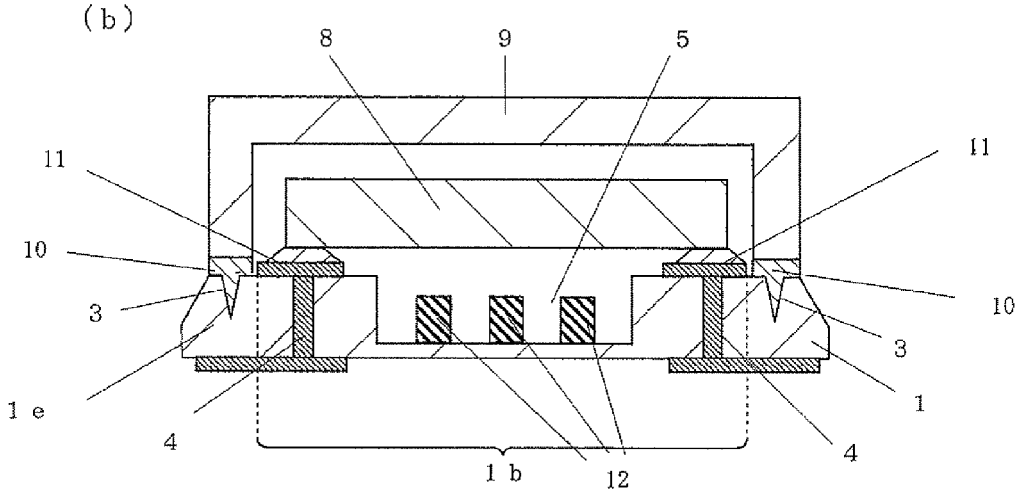

FIGS. 12(a) and 13(a) are perspective views of wiring boards according to embodiments of the invention, and FIGS. 12(b) and 13(b) are cross-sectional views of electronic apparatuses according to embodiments of the invention. In FIGS. 12 and 13, reference numeral 8 denotes an electronic component, reference numeral 9 denotes a lid member, reference numeral 10 denotes a sealant, reference numeral 11 denotes a bonding material, and reference numeral 12 denotes a second electronic component. The example shown in FIG. 12(a) illustrates an example of a wiring board 1e obtained by dividing the multiple patterning wiring board shown in FIGS. 1 and 2. The example shown in FIG. 13(a) illustrates an example of a wiring board 1e obtained by dividing the multiple patterning wiring board shown in FIGS. 5 and 6.

By dividing the multiple patterning wiring board of the invention described above along the dividing groove 2, a plurality of wiring boards 1e of the invention are produced. Then, as shown in FIGS. 12(b) and 13(b), an electronic component 8 is mounted onto the electronic component mounting region 1b and a lid member 9 is bonded so as to cover the electronic component 8, whereby an electronic apparatus of the invention is produced.

A wiring board 1e of the invention is a wiring board obtained by dividing any of the multiple patterning wiring boards having the above configurations along the dividing groove 2. With this configuration, the formation of a burr or crack is reduced at the outer edge portion of the wiring board 1e, and the opening width of the groove 3 is less than the width of the side wall portion, and therefore there is an appropriate thickness between the outer edge of the divided wiring board 1e and the groove 3, and this portion will not be easily cracked due to the wiring board 1e bumping into another wiring board 1e or the like during transportation, so that the outer edge of the wiring board 1e can be easily recognized by an image recognition apparatus or the like, and an electronic component 8 can be mounted onto the wiring board 1e using the outer edge of the wiring board 1e as a reference with high positional accuracy.

Further, a wiring board 1e of the invention is a wiring board obtained by dividing any of the multiple patterning wiring boards configured as in the examples shown in FIGS. 1 to 6 along the dividing groove 2. As in the example shown in FIG. 13(a), the wiring board 1e has, in one main face, an electronic component mounting region 1b and a groove 3 is located between the electronic component mounting region 1b and the outer edge of the wiring board 1e and ends thereof extend to opposing sides. With this configuration, the surface area of the groove 3 at the corner of the wiring board 1e can be increased as viewed from above and the amount of sealant 10 at the corner can be increased, and as a result, the bonding strength of the corner of the wiring board 1e to a lid member 9 can be increased. Specifically, for example, when the wiring board 1e and a lid member 9 are bonded with a sealant 10 made of a thermosetting resin, a situation can be suppressed in which a gap is created between the corner of the wiring board 1e and the sealant 10 due to application of heat to cure the sealant 10, and the thickness of the sealant 10 at the corner of the wiring board 1e is reduced, and as a result, the bonding strength between the wiring board 1e and the lid member 9 is reduced. Further, the groove 3 is cross-shaped at the corner where thermal stress due to the difference in thermal expansion between the wiring board 1e and the lid member 9 becomes large, so that the bonding surface area of the sealant 10 is increased and the sealant 10 filling the groove 3 will serve as a resistance against the horizontal force, and as a result, the bonding reliability between the lid member 9 and the wiring board 1e is improved.

An electronic apparatus of the invention is an electronic apparatus, as in the examples shown in FIGS. 12(b) and 13(b), in which an electronic component 8 is mounted on the electronic component mounting region 1b of the wiring board 1e having the above configuration and a lid member 9 is bonded so as to cover the electronic component 8, and it is therefore possible to fill the groove 3 with a sealant 10 and securely bond the wiring board 1e and the lid member. Further, the formation of a burr or crack at the outer edge portion of the wiring board 1e of the electronic apparatus is reduced, and therefore the outer edge of the electronic apparatus can be easily recognized by an image recognition apparatus or the like, and the electronic apparatus can be mounted onto an external electrical circuit board using the outer edge of the electronic apparatus as a reference with high positional accuracy. The example shown in FIG. 12(b) illustrates an electronic apparatus in which an electronic component 8 is mounted on the electronic component mounting region 1b and a cap-shaped lid member 9 is bonded so as to cover the electronic component. The example shown in FIG. 13(b) illustrates an electronic apparatus in which the electronic component mounting region 1b has a recess portion 5, second electronic components 12 are mounted on the bottom of the recess portion 5, an electronic component 8 is mounted on the opening of the recess portion 5 so as to cover the recess portion 5, and a cap-shaped lid member 9 is bonded so as to cover the electronic component 8.

The electronic component 8 is a semiconductor device such as an IC chip or LSI chip, a piezoelectric element such as a crystal oscillator or piezoelectric vibrator, or any of various sensors.

The electronic component 8 is mounted as follows. In the case where the electronic component 8 is a flip-chip type semiconductor device, for example, the electronic component 8 is mounted by electrically or mechanically connecting an electrode of the semiconductor device and a wiring conductor 4 via a bonding material 11 such as a solder bump, a gold bump or a conductive resin (anisotropic conductive resin or the like). In the case of the example shown in FIG. 12, after the electronic component 8 has been bonded to the electronic component mounting region 1b using the bonding material 11, an underfill may be injected between the electronic component 8 and the wiring board 1e. Alternatively, for example, in the case where the electronic component 8 is a wire-bonding type semiconductor device, after the electronic component 8 has been fixed to the electronic component mounting region 1b using the bonding material 11, an electrode of the semiconductor device and a wiring conductor 4 are electrically connected via a bonding wire. Further, in the case where the electronic component 8 is a piezoelectric element such as a crystal oscillator, for example, the piezoelectric element is fixed using a bonding material 11 such as a conductive resin and an electrode of the piezoelectric element and a wiring conductor are electrically connected. Where necessary, a second electronic component 12 such as a resistive element or capacitive element may be mounted in the periphery of the electronic component 8. For example, as in the example shown in FIG. 13(b), in the case where the second electronic component 12 is mounted within the recess portion 5, the size of the electronic apparatus can be reduced as compared to the case where the electronic component 8 and the second electronic component 12 are mounted in the same plane.

The lid member 9 is a cap-shaped lid member made of a metal, ceramics, glass, a resin or the like. The lid member 9 is preferably made of a material having a thermal expansion coefficient that is close to that of the insulating base body of the wiring board 1e. In the case where, for example, the insulating base body is made of an aluminum oxide sintered body and a lid member made of a metal is used as the lid member 9, the lid member may be made of an Fe—Ni (iron-nickel) alloy, an Fe—Ni—Co (iron-nickel-cobalt) alloy or the like. In the case where the electronic component 8 is a solid state image sensor or light emitting element, it is possible to use, as the lid member 9, not only a lid member made of a light transmitting plate material made of glass, a resin or the like, but also a lid member having a light transmitting lens made of glass, a resin or the like, or a lens attached thereto.

Further, the electronic component 8 may be coated with a resin such as epoxy resin or silicone resin as necessary. For example, in the case where the electronic component 8 is a light emitting element, the electronic component 8 may be covered with a resin containing a phosphor, so that the wavelength of the light emitted from the light emitting element can be converted by the phosphor contained in the covering resin.

The sealant 10 can be made of a thermosetting or photo-curable resin material such as acrylic resin, epoxy resin, phenol resin, cresol resin, silicone resin or polyether amide resin, or low melting glass. The sealant 10 may optionally contain a dark color pigment or dye such as black, brown, dark brown, dark green or deep blue. With this configuration, in the case where, for example, the electronic component 8 is a solid state image sensor and a light-shielding lid member 9 having a light transmitting plate material or lens attached to an upper portion thereof is bonded, it is possible to prevent unwanted light from entering through the sealant 10. Alternatively, in the case where the electronic component 8 is a light emitting element and a light-shielding lid member 9 whose upper portion is partially light transmitting is bonded, it is possible to prevent the light from the light emitting element from leaking to the sides through the sealant 10.

The invention can be modified in various ways within a range not departing from the gist of the invention. For example, in the multiple patterning wiring board described above, a recess portion 5 and a groove 3 are formed only in one main face of the base substrate 1, but a dividing groove 2, a groove 3 and a recess portion 5 may be formed on the other main face. In this case, the depth of the groove 3 formed in the other main face is also set to be less than the depth of the dividing groove 2 and the recess portion 5 formed in the other main face.

The electronic apparatus may be produced by mounting an electronic component 8 onto each wiring board region 1a of the multiple patterning wiring board and bonding a lid member 9 thereto, and thereafter dividing the multiple patterning wiring board along the dividing groove 2.

REFERENCE SIGNS LIST

1: Base substrate
1a: Wiring board region
1b: Electronic component mounting region
1c: Lid member bonding region
1d: Second electronic component mounting region
1e: Wiring board
2 (2x, 2y): Dividing groove
2a (2ya): Second dividing groove
3 (3x, 3y): Groove
4: Wiring conductor
5: Recess portion
6, 7: Cutter blade
8: Electronic component
9: Lid member
10: Sealant
11: Bonding material
12: Second electronic component

The invention claimed is:

1. A multiple patterning wiring board, comprising:
a base substrate comprising, in one main surface thereof,
- a plurality of wiring board regions arranged in rows and columns, the wiring board regions each comprising an electronic component mounting region in a center portion thereof,
- a dividing groove at borders between the wiring board regions,
- a lid member bonding region disposed between the electronic component mounting region and the dividing groove,
- a groove disposed in the lid member bonding region,
- a first wiring on an upper side surface of the base substrate,
- a second wiring on a lower side surface of the base substrate, and a conductive via connecting the first wiring to the second wiring,
- wherein the groove has a width less than a width of the lid member bonding region and a depth less than a depth of the dividing groove, and
- wherein, in a cross sectional surface perpendicular to the one main surface of the base substrate, the dividing groove and the groove are both V-shaped, and a bottom angle of the groove is larger than a bottom angle of the dividing groove.

2. The multiple patterning wiring board according to claim 1, wherein the groove extends continuously along the dividing groove between adjacent two regions of the plurality of wiring board regions.

3. A wiring board obtained by dividing the multiple patterning wiring board according to claim 1 along the dividing groove.

4. A wiring board obtained by dividing the multiple patterning wiring board according to claim 2 along the dividing groove,
wherein the wiring board comprises, in one main face,
the electronic component mounting region,
and
the groove is located between the electronic component mounting region and an outer edge of the wiring board, and ends thereof extend to opposing sides.

5. An electronic apparatus, comprising:
an electronic component mounted on the electronic component mounting region of the wiring board according to claim 3; and
a lid member bonded so as to cover the electronic component.

6. An electronic apparatus, comprising:
an electronic component mounted on the electronic component mounting region of the wiring board according to claim 4; and
a lid member bonded so as to cover the electronic component.

* * * * *